United States Patent [19]

Nelson et al.

[11] Patent Number: 5,689,279
[45] Date of Patent: *Nov. 18, 1997

[54] INTEGRATED ELECTRO-OPTICAL PACKAGE

[75] Inventors: Ronald J. Nelson, Scottsdale; John W. Stafford, Phoenix, both of Ariz.

[73] Assignee: Motorola, Schaumburg, Ill.

[*] Notice: The term of this patent shall not extend beyond the expiration date of Pat. No. 5,432,358.

[21] Appl. No.: 415,286

[22] Filed: Apr. 3, 1995

Related U.S. Application Data

[62] Division of Ser. No. 216,995, Mar. 24, 1994, Pat. No. 5,432,358.

[51] Int. Cl.[6] .................... G09G 3/32; H01L 33/00
[52] U.S. Cl. .................. 345/82; 257/81; 257/88; 257/98; 257/99; 361/806; 361/820
[58] Field of Search .................... 257/81, 88, 98, 257/99; 361/806, 820; 345/82

[56] References Cited

U.S. PATENT DOCUMENTS

| | | | |
|---|---|---|---|
| 3,940,846 | 3/1976 | Grenon | 257/93 |
| 4,445,132 | 4/1984 | Ichikawa et al. | 345/82 |
| 4,933,601 | 6/1990 | Sagawa et al. | 257/88 |

*Primary Examiner*—Richard Hjerpe
*Assistant Examiner*—Amare Mengistu
*Attorney, Agent, or Firm*—Eugene A. Parsons

[57] ABSTRACT

An integrated electro-optical package including a semiconductor chip with a large array of light emitting devices formed thereon and cooperating to generate a complete real image. The light emitting devices are positioned in rows and columns and connected to pads adjacent outer edges of the chip. A window frame substrate having a central opening therethrough coextensive with the real image generated by the chip and mounting pads, bump bonded to the pads on the chip. A plurality of driver circuits connected to the light emitting devices through terminals on the window frame substrate. A lens mounted to the substrate over the opening and on a side opposite the chip to magnify the real image and produce an easily viewable virtual image.

17 Claims, 9 Drawing Sheets

INTEGRATED ELECTRO-OPTICAL PACKAGE

This is a division of application Ser. No. 08/216,995, filed Mar. 24, 1994, now U.S. Pat. No. 5,432,358.

FIELD OF THE INVENTION

The present invention pertains to packages containing electrical and optical components connected in cooperation and more specifically to a package for electrically connecting optical components and semiconductor chips in electrical circuitry.

BACKGROUND OF THE INVENTION

Generally, a semiconductor chip, or integrated circuit, is mounted on a printed circuit board or the like and the accepted method for connecting the chip to external circuits is to use standard wire bond technology. However, when a semiconductor chip having a relatively large array of electrical components or devices formed thereon is to be connected, standard wire bond techniques can become very difficult. For example, if a relatively large array (greater than, for example, 10,000 or 100×100) of light emitting diodes is formed on a semiconductor chip with a pitch (center-to-center separation) of P, then bond pads on the perimeter of the semiconductor chip will have a 2P pitch. This is true because every other row and every other column goes to an opposite edge of the perimeter to increase the distance between bond pads as much as possible.

At the present time wire bond interconnects from bond pads having a pitch of 4.8 milli-inches is the best that is feasible. Thus, in the array mentioned above of 100×100 light emitting diodes the bond pads on the perimeter of the semiconductor chip would have a minimum pitch of 4.8 milli-inches, with 50 bond pads situated along each edge of the perimeter. As more devices are included in the array, more bond pads are required and the perimeter size to accommodate the additional bond pads increases at an even greater rate. That is, since the minimum pitch of the bonding pads is 4.8 milli-inches, the pitch of the devices in the array can be as large as 2.4 milli-inches, or approximately 61 microns, without effecting the size of the chip. Thus, even if the devices can be fabricated smaller than 61 microns, the minimum pitch of the bonding pads will not allow the perimeter of the chip to be made any smaller. It can quickly be seen that the size of the semiconductor chip is severely limited by the limitations of the wire bonding technology.

Further, it has been common practice to mount semiconductor chips and interface circuitry on a single board. The problem that arises is the large amount of surface area required to mount and connect various components.

Thus, there is a need for interconnect and packaging structures and techniques which can substantially reduce the limitation on size of semiconductor chips and which can reduce the amount of required surface area.

Accordingly, it is a purpose of the present invention to provide integrated electro-optical packages which are not limited in size by the electrical connections.

It is another purpose of the present invention to provide integrated electro-optical packages which are substantially smaller than previous integrated packages.

It is still another purpose of the present invention to provide integrated electro-optical packages which contain substantially greater numbers of light generating devices than previous integrated packages.

It is yet another purpose of the present invention to provide integrated electro-optical packages which contain arrays of light generating devices with substantially greater numbers of devices than previous integrated packages.

SUMMARY OF THE INVENTION

The above problems and others are substantially solved and the above purposes and others are realized in an integrated electro-optical package including a semiconductor chip having a major surface with an array of light emitting devices formed on the major surface at a central portion thereof and cooperating to generate a complete real image. Each of the light emitting devices have first and second electrodes for activating the light emitting devices. The semiconductor chip further as external connection/mounting pads adjacent outer edges thereof and outside of the central portion of the major surface with the first electrodes of the light emitting devices being connected to a first plurality of the external connection/mounting pads and the second electrodes of the light emitting devices being connected to a second plurality of the external connection/mounting pads. A window frame substrate has a major surface and defines a central optically transparent light passage therethrough substantially coextensive with the real image at the central portion of the major surface of the semiconductor chip. The window frame substrate further has a plurality of electrical conductors formed therein, each extending from a mounting pad adjacent an edge of the central passage to a connection pad on the major surface of the window frame substrate. The window frame substrate can be, for example, formed of glass or some other suitable transparent material defining a central optically transparent light passage (window) therethrough with the electrical conductors formed as a frame around the window or the window frame substrate can be formed of opaque or other material with an opening therethrough defining the central optically transparent light passage. The major surface of the semiconductor chip is mounted on the major surface of the window frame substrate with the first and second pluralities of external connection/ mounting pads being in electrical contact with the mounting pads of the window frame substrate and the real image at the central portion of the major surface of the semiconductor chip being axially aligned and substantially coextensive with the central passage in the major surface of the window frame substrate. A plurality of driver and controller circuits having data input terminals and further having control signal output terminals are connected to the first and second terminals of the light emitting devices for activating the light emitting devices to generate real images in accordance with data signals applied to the data input terminals.

In the preferred embodiment the external connection/ mounting pads of the semiconductor chip are bump bonded to the mounting pad adjacent an edge of the central opening in the window frame substrate to substantially reduce the allowable pitch of the connection/mounting pads. Also, the connection pads on the major surface of the window frame substrate are positioned into a matrix of rows and columns to allow a substantially greater number of connection pads in a substantially smaller surface area.

BRIEF DESCRIPTION OF THE DRAWINGS

Referring to the drawings.

DESCRIPTION OF THE PREFERRED EMBODIMENT

Figure 1:
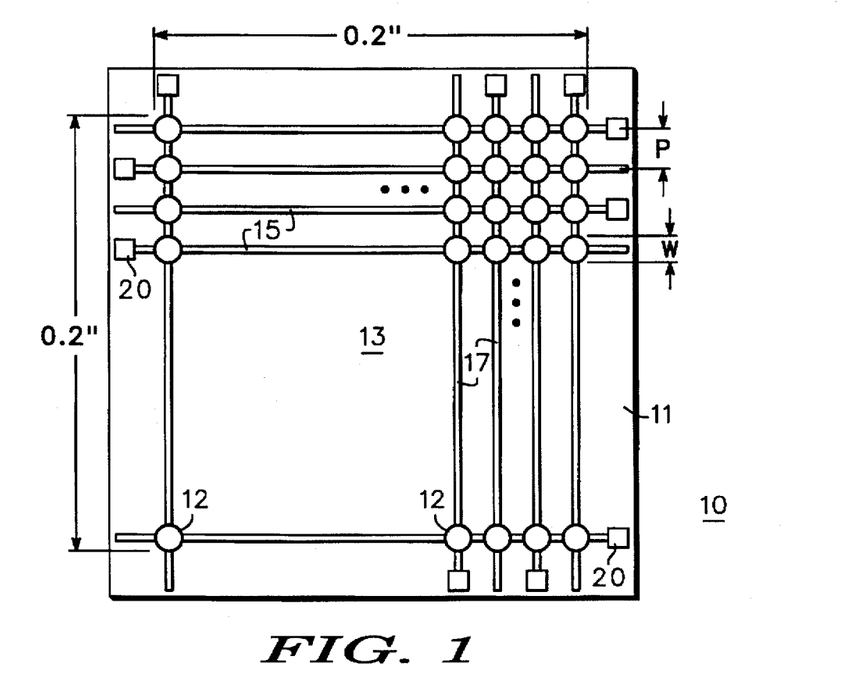
FIG. 1 is a greatly enlarged view in top plan of a semiconductor chip having an array of light emitting devices thereon.

Referring specifically to FIG. 1, a greatly enlarged view in top plan of a semiconductor chip 10 having an array of light emitting devices thereon is illustrated. For simplicity of illustration, only a representative portion of semiconductor chip 10 has been completed. Semiconductor chip 10 has a major surface 11 with a plurality of light emitting devices 12 formed thereon. In this embodiment, light emitting devices 12 are light emitting diodes but it will be understood that a variety of devices can be utilized, including but not limited to light emitting diodes, surface emitting lasers, field emission devices, etc. In this embodiment, each light emitting device 12 defines a pixel, with light emitting devices 12 positioned in rows and columns and cooperating to generate a complete real image, when activated, at a central portion 13 of major surface 11. Each light emitting device 12 has first and second electrodes (not shown) to provide an activating potential thereto with the first electrodes of each light emitting device 12 being attached to one of a plurality of horizontal electrical conductors 15 and the second electrode of each light emitting device 12 being attached to one of a plurality of vertical electrical conductors 17. Semiconductor chip 10 further has external connection/mounting pads 20 adjacent outer edges thereof and outside of central portion 13 of major surface 11. The first electrodes of light emitting devices 12 are connected to a first plurality of external connection/mounting pads 20 by conductors 15, defining rows of pixels, and the second electrodes of light emitting devices 12 are connected to a second plurality of external connection/mounting pads 20 by conductors 17, defining columns of pixels.

Light emitting devices 12 are formed on semiconductor chip 10 in an area of major surface 11 less than approximately 20 microns in diameter (W), in the embodiment illustrated approximately 10 microns in diameter. Also, the pitch, P, or spacing between centers of light emitting devices 12, is less than approximately 30 microns, and in the present embodiment is 20 microns. To completely distribute connection/mounting pads 20 around the periphery of semiconductor chip 10, connection/mounting pads 20 are attached to alternate horizontal electrical conductors 15 and alternate vertical conductors 17. Thus, the space available between adjacent connection/mounting pads 20 is 2P, or in this specific embodiment 20 microns.

Figure 2:
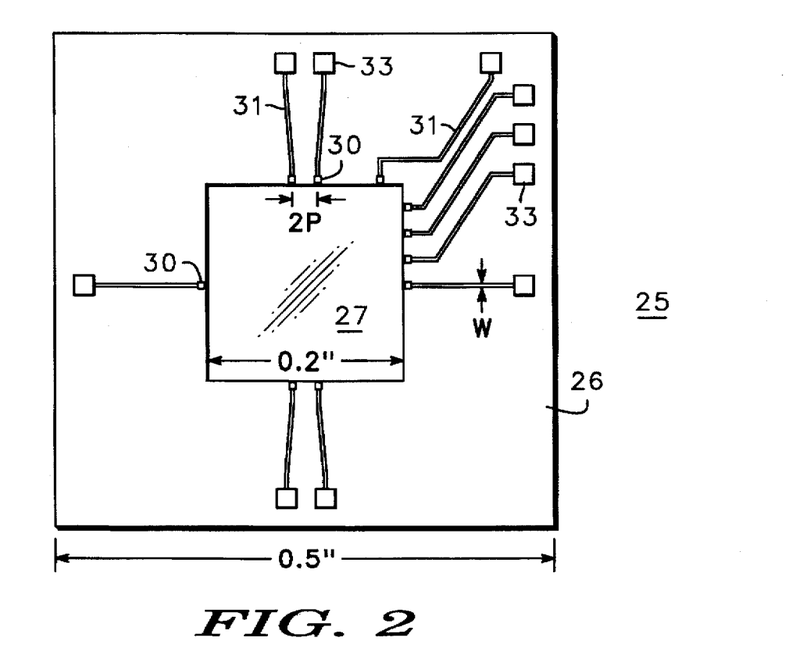
FIG. 2 is an enlarged view in top plan of a window frame substrate.

Referring specifically to FIG. 2, an enlarged view in top plan of a window frame substrate 25 is illustrated. Substrate 25 is referred to herein as a "window frame" because it has a major surface 26 with a central optically transparent light passage 27, or window, defined therethrough. In the simplest embodiment, window frame substrate 25 is formed of a planar piece of optically transparent material, such as glass, so that the central passage 27 is simply a clear portion of substrate 25. In a slightly different embodiment (to be explained in more detail presently), the window frame substrate, which may be opaque, is formed with a central opening therethrough, which opening serves as central passage 27. Central passage 27 is substantially the same size as central portion 13 of semiconductor chip 10 so that the real image generated by light emitting devices 12 in cooperation is completely visible therethrough when semiconductor chip 10 is placed in register on window frame substrate 25. A plurality of mounting pads 30 are positioned around the periphery of central passage 27 so as to each contact a separate connection/mounting pad 20 on semiconductor chip 10 when semiconductor chip 10 is properly registered thereon. A plurality of electrical conductors 31 electrically connect mounting pads 30 to a similar plurality of connection pads 33 positioned on the major surface 26 and around the outer periphery of substrate 25.

The pitch of mounting pads 30 is equal to the 2P spacing of connection/mounting pads 20 on semiconductor chip 10 so that each mounting pad 30 can be as large as P without causing electrical problems. Further, by fanning out electrical conductors 31, connection pads 33 can be constructed large enough to provide easy electrical contact thereto. For example, if the array of light emitting devices 12 includes 40,000 devices (e.g., 200×200) and each device includes an area having a 10 micron diameter with a pitch P of 20 microns, then the area of the center portion 13 of semiconductor chip 10 will be less than 0.2 inches on a side. Window frame substrate 25, in this specific embodiment, is constructed with a central passage 27 approximately 0.2 inches on a side and an outer periphery of 0.5 inches on a side. Thus, the 200 connection pads on each side of the periphery of window frame substrate 25 have approximately 60 microns of pitch available.

Figure 3:
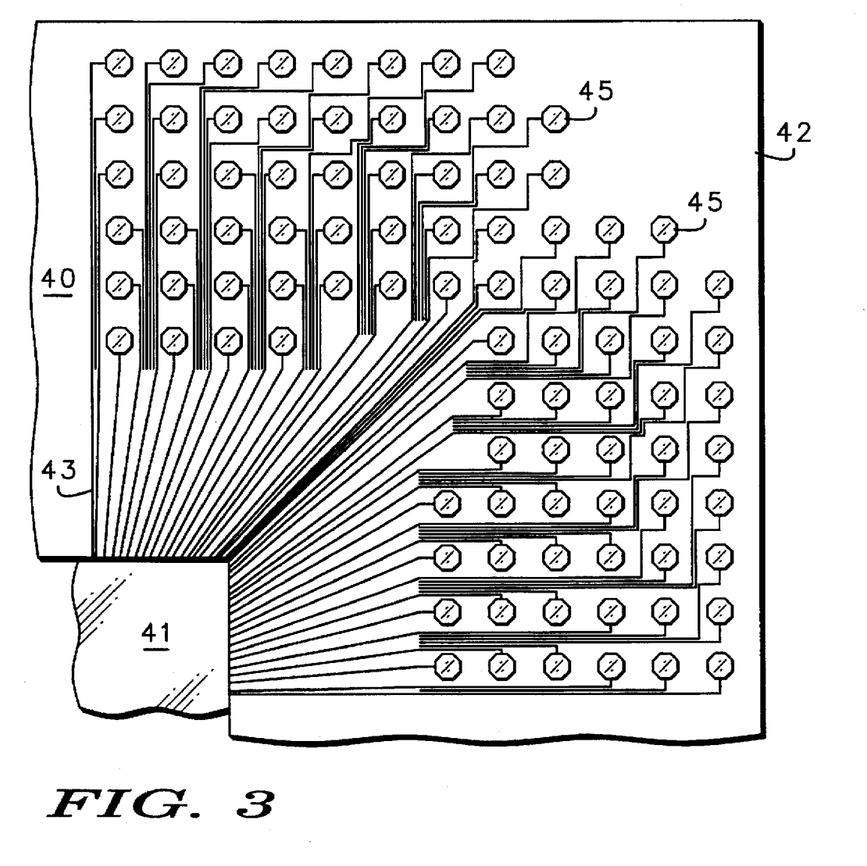
FIG. 3 is a greatly enlarged view in top plan of another embodiment of a window frame substrate, portions thereof broken away.
Figure 4:
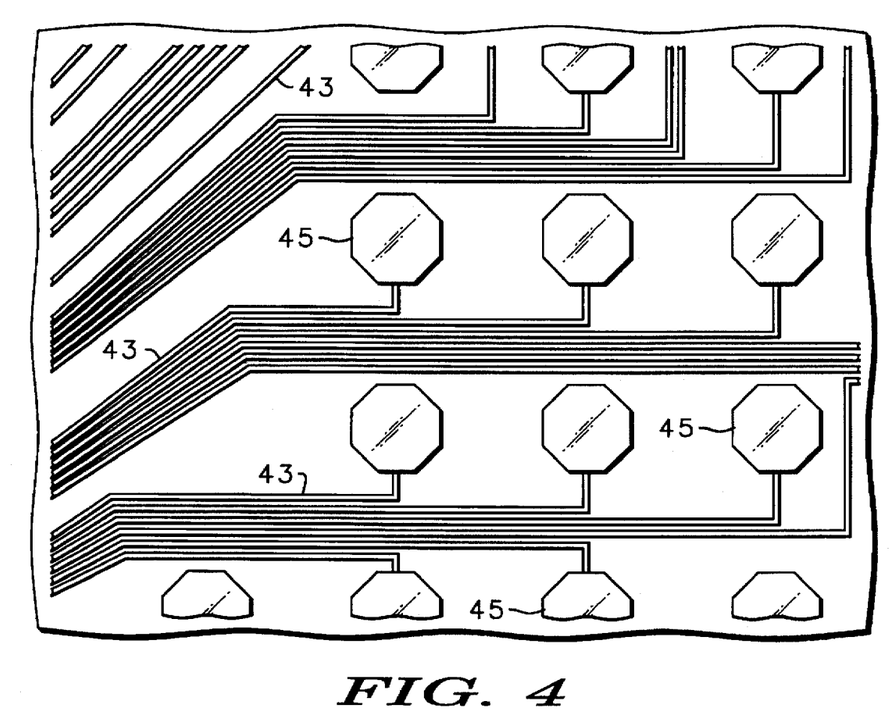
FIG. 4 is a greatly enlarged view of a portion of FIG. 3 illustrating portions thereof in greater detail.

Referring specifically to FIG. 3, a greatly enlarged view in top plan of another embodiment of a window frame substrate 40, portions thereof broken away, is illustrated. A portion of substrate 40 is illustrated in a greatly enlarged view in FIG. 4 illustrating portions of substrate 40 in greater detail. In this embodiment a central optically transparent passage 41 is positioned as described in conjunction with FIG. 2 and a plurality of electrical conductors 43 are positioned on a major surface 42 of substrate 40 and are fanned out from the periphery of central passage 41 into contact with a plurality of connection pads 45. Connection pads 45 are positioned in a matrix of rows and columns on major surface 42 surrounding central passage 41. Generally, it is anticipated that connecting pads 45 can be positioned in the matrix with a pitch in the range of approximately 25 milli-inches to 50 milli-inches to allow sufficient space for electrical conductors 43 to extend therebetween as illustrated. For example, a matrix of connection pads 45 with a pitch of 40 milli-inches allows over 500 connection pads 43 on a one inch by one inch substrate with a central passage 41 of 0.2 inches by 0.4 inches.

In many applications the electrical conductor widths and pad sizes, as well as spacing, may be such that difficulty will be encountered in the fabrication, especially for the window frame substrate. However, examples of substrate material on which 10 to 15 micron wide electrical conductors with a pitch of 40 microns can be fabricated and which can accommodate a rectangular central opening include: glass; ground and polished alumina ceramic; ground alumni ceramic or alumina nitride with a single layer of a thin organic dielectric, such as polyimide or BCB, on which a thin film pattern has been fabricated; and silicon which can be anisotropically etched.

In the instance in which window frame substrate 25 is formed of glass, standard thin film metallization can be utilized in which layers of metal are deposited by, for example, sputtering. In a typical metallization system, a first layer of chromium is applied by sputtering to operate as an adhesive layer on the glass. A second layer of copper is applied over the chromium to provide the desired electrical conduction and a layer of gold is applied over the copper to provide a barrier and adhesive layer for the bumps or further connections. It should be understood that the metallization can be either an additive or subtractive method with the patterning and etching being performed by any of the various methods well known in the art to provide the desired final structure.

Further, in the instance in which window frame substrate 25 is formed of glass the glass is selected to have approximately the same thermal coefficient of expansion as semiconductor chip 10 so that when semiconductor chip 10 is fixedly bonded to window frame substrate 25 changes in ambient temperature produce substantially the same amount of expansion or contraction and semiconductor chip 10 is not damaged. It will of course be understood that minor differences in the thermal coefficients which produce minor differences in expansion/contraction can be tolerated if the amount of change between semiconductor chip 10 and window frame substrate 25 are not large enough over the operating temperature range of the structure to damage semiconductor chip 10.

Figure 5:
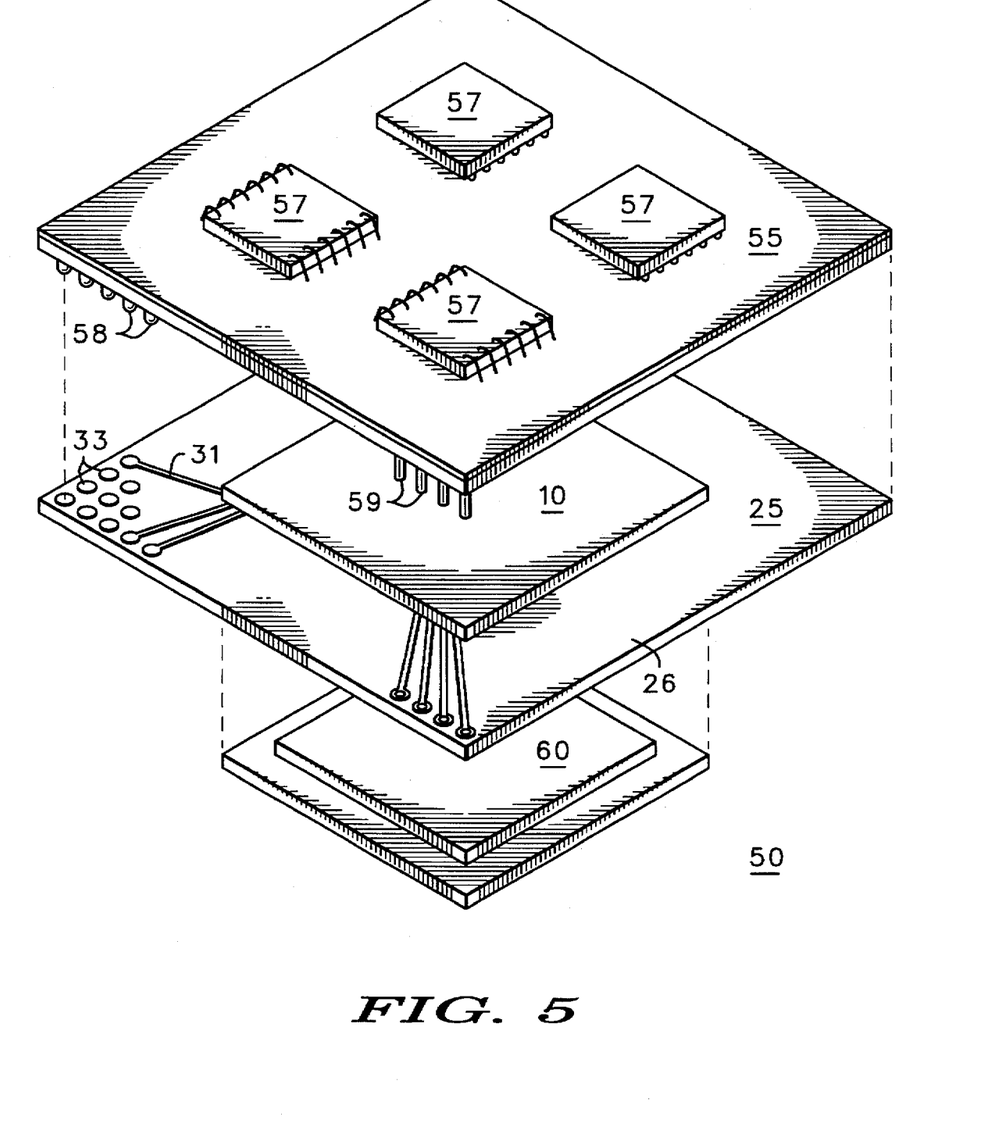
FIG. 5 is an exploded view in perspective illustrating the relative positions of the components of FIGS. 1 and 2.
Figure 6:
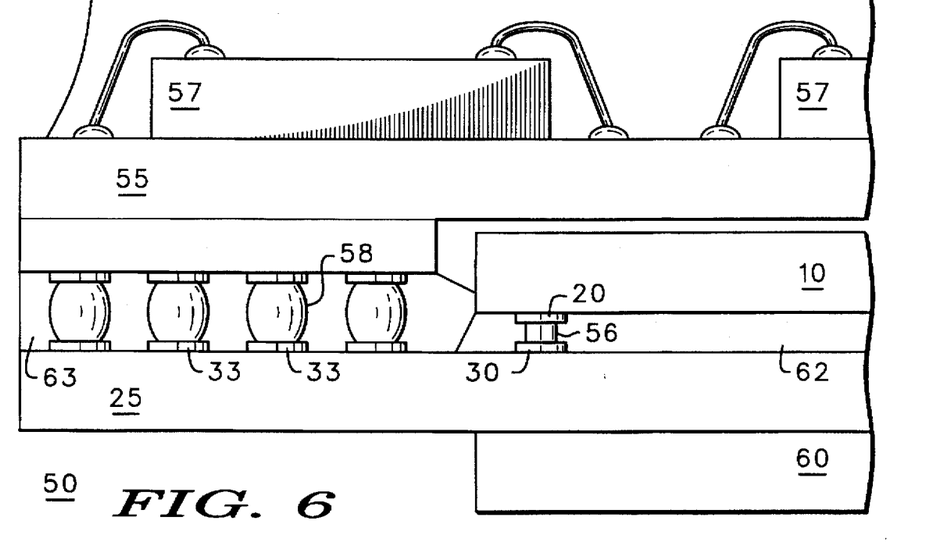
FIG. 6 is an enlarged view of the components of FIG. 5, portions thereof broken away, assembled into a complete package.

An exploded view in perspective illustrating the relative positions of the components of FIGS. 1 and 2 (or FIG. 3) and additional components included in an electro-optical package 50 is illustrated in FIG. 5. An enlarged view, portions thereof broken away, of the components of FIG. 5 assembled into a complete electro-optical package 50 is illustrated in FIG. 6. In the assembly process, semiconductor chip 10 is inverted so that major surface 13 is down and connection/mounting pads 20 are positioned to each contact a separate mounting pad 30 on window frame substrate 25 when semiconductor chip 10 is properly registered. Semiconductor chip 10 has bumps 56 (see FIG. 6) of contacting material deposited on connection/mounting pads 20 for electrically and physically connecting semiconductor chip 20 to substrate 25. Bumps 56 are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns. Some compatible metal may improve the assembly procedures, e.g., gold metallization or gold plating on mounting pads 30 of substrate 25.

In one fabrication technique, semiconductor chip 10 includes gold bumps and is thermo compression bonded to window frame substrate 25. At the point illustrated in FIG. 5 where semiconductor chip 10 is bonded to substrate 25, semiconductor chip 10 can be easily tested and/or burned in prior to additional assembly of the package. This ability to provide an intermediate test point can be a substantial cost and time saving in the packaging procedure.

Besides semiconductor chip 10 of FIG. 1 and window frame substrate 25 of FIG. 2, this specific embodiment of package 50 includes a mounting board 55 having a plurality of driver and control circuits 57 mounted on an upper major surface thereof. Driver and control circuits 57 generally are formed as smaller integrated circuits which are wire bonded or bump bonded to electrical contacts on the upper major surface of mounting board 55. Mounting board 55 is, for example, a convenient printed circuit board, such as FR4 or the like, and has either bumps 58 of contact material, such as C5 solder, solderable plated metal, or the like, or connecting pins 59. Because the pitch of connection pads 33 is (or can be) relatively large, relatively large bumps or pins can be utilized at this point.

The final additional component in package 50 is a lens 60 which is fabricated to overlie the central passage in window frame substrate 25 opposite semiconductor substrate 10. Lens 60 is designed to magnify the real image generated by the array of light emitting devices 12 on semiconductor substrate 10. In this specific embodiment, lens 60 is affixed to the underside of window frame substrate 25 by some convenient optically transparent epoxy or the like and is fabricated so as to simply overlie central passage 27 of window frame substrate 25. At least the interstice between window frame substrate 25 and semiconductor chip 10 mounted thereon is filled with an optically transparent material 62. Also, the interstice between window frame substrate 25 and mounting board 55 is filled with an encapsulating material 63, which may be any convenient material to provide support and make package 50 a more robust package. Here it should be noted that the edges of semiconductor chip 10 are sufficiently close to mounting board 55 to act like an encapsulant dam so that the interstice between the upper surface of semiconductor chip 10 and mounting board 55 is left open or unfilled. Thus, semiconductor chip 10 and mounting board 55 are not physically attached together and different coefficients of expansion will have little or no effect. In some instances it may be convenient to encapsulate all interstices in package 50 with the same optically transparent material 62 and in some instances it may be more convenient and less expensive to fill the interstices with different encapsulating material.

In either case, it should be understood that for best results optically transparent material 62, the glass of window frame substrate 25 and lens 60 should be constructed with indices of refraction which is as close together as practical. If, for example, the index of refraction of optically transparent material 62 and the glass of window frame substrate 25 differs substantially there is a tendency for light to reflect at the interface back into semiconductor chip 10 and the efficiency of package 50 is reduced. Similarly the interface between window frame 25 and lens 60 should be as small a change as is practical or tolerable. Generally, an index of refraction of approximately 1.5 for window frame substrate 25 has been found to be acceptable.

Thus, a window frame substrate of glass or the like, such as substrate 25, has the added advantage of providing additional environmental protection for the semiconductor chip. Also, because transparent material, such as glass and the like can be provided which has a coefficient of thermal expansion which is the same as, or very close to, the coefficient of thermal expansion of the semiconductor chip, substantial improvements in thermal cycling life are achieved with this embodiment.

Figure 7:
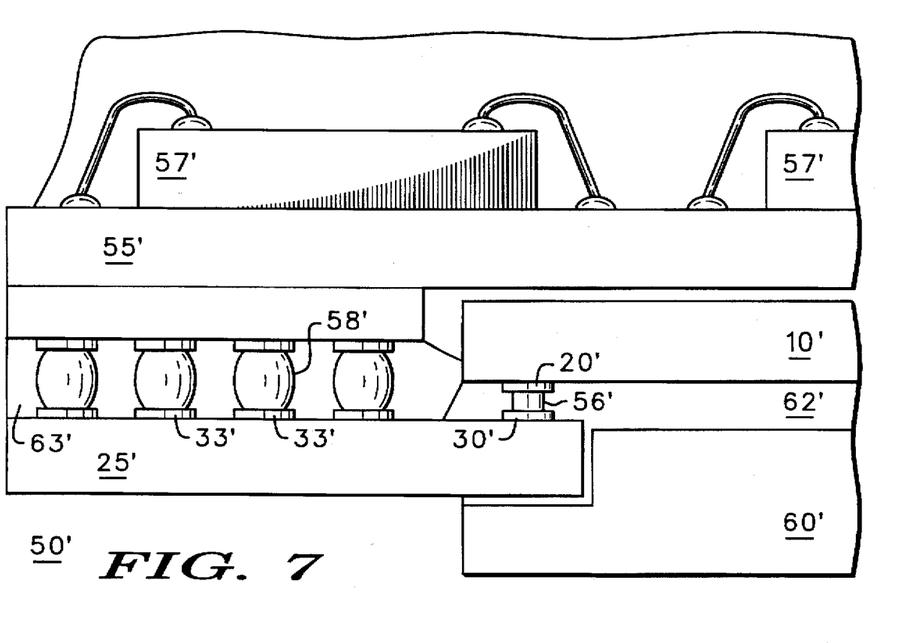
FIG. 7 is an enlarged view of the components of FIG. 5, portions thereof broken away, assembled into a complete package in a different embodiment.

An enlarged view similar to that of FIG. 6, of the components of FIG. 5 assembled into another embodiment of a complete electro-optical package 50' is illustrated in FIG. 7. In the embodiment of FIG. 7, portions that are similar to those described in conjunction with FIG. 6 are designated with similar numbers having a prime added to indicate the different embodiment. In this embodiment window frame substrate 25' is formed with a central opening therethrough for the optically transparent central passage and lens 60' is constructed to fit at least partially into the central opening. Also, an optically transparent material 62' is utilized to fill the interstice between semiconductor chip 10' and lens 60' and fixedly holds lens 60' in the correct position.

Figure 8:
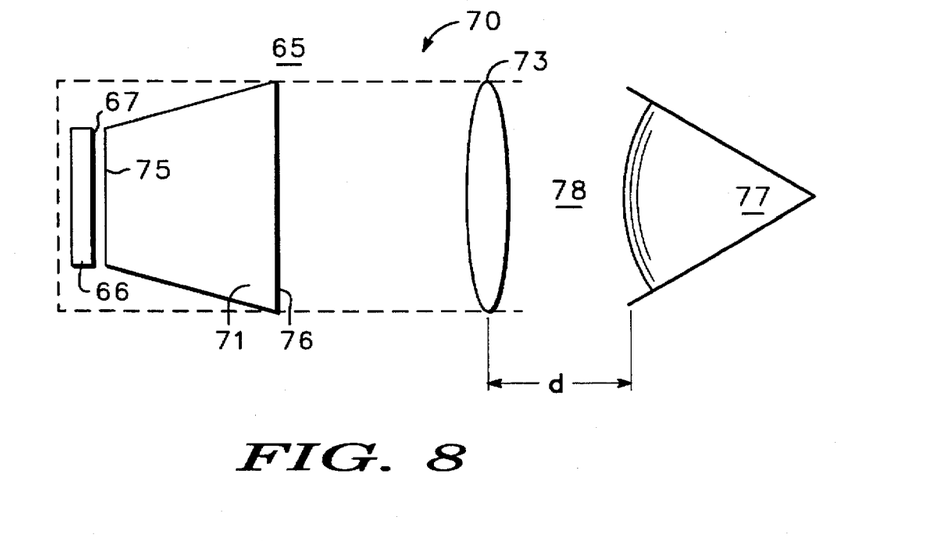
FIG. 8 is a simplified schematic view of a miniature virtual image display incorporating the package of FIGS. 6 or 7.
Figure 9:
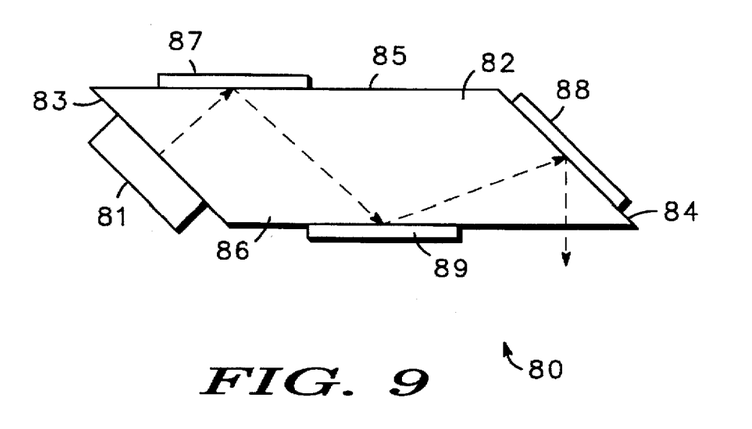
FIGS. 9 and 10 are additional simplified schematic views, similar to FIG. 8, of other miniature virtual image displays incorporating the package of FIGS. 6 or 7.

It should be understood that the real image generated by the array of light emitting devices 12 on semiconductor substrate 10 is too small to properly perceive with the human eye and generally requires a magnification of at least 10× for comfortable and complete viewing. Lens 60' can be a single lens with additional optical magnification supplied by an external system or lens 60 can include a complete magnification system. Further, lens 60 can be fabricated from glass, plastic or any other material or method well known to those skilled in the optical art. Also, in some applications lens 60 may be a complete external magnification system and may not be physically attached as a portion of package 50. Several examples of optical magnification system which may be incorporated into lens 60 or applied externally thereto are illustrated in FIGS. 7 through 9, explained below.

Referring to FIG. 7, a miniature virtual image display 65 is illustrated in a simplified schematic view. Display 65 includes image generation apparatus 66, similar to electro-optical package 50 described above, for providing a real image at an area 67. A fixed optical system 70, in this specific embodiment includes a coherent bundle 71 of optical fibers and a lens system 73. Bundle 71 has a first surface 75 positioned adjacent the area 67 of apparatus 66 and a second surface 76 defined at the opposite end of bundle 71. A single lens, representing lens system 73, is positioned in spaced relation to surface 76 of bundle 71 and, in cooperation with bundle 71, produces a virtual image viewable by an eye 77 spaced from a viewing aperture 78 generally defined by lens system 73.

As the semiconductor technology reduces the size of the semiconductor chip and/or the light generating devices on the chip, greater magnification and smaller lens systems are required. Reducing the size of the lenses while increasing the magnification results in greatly limiting the field of view, substantially reducing eye relief and reducing the working distance of the lens system.

Surface 75 of bundle 71 is positioned adjacent area 67 of apparatus 66 so as to pick up real images generated by apparatus 66 and transmit the image by way of the optical fibers to surface 76. Bundle 71 is tapered along the length thereof so that the image at surface 76 is larger than the real image at surface 75. The taper in the present embodiment provides an image at surface 76 which is twice as large as the image at surface 75, which is equivalent to a power of two magnification. It will be understood by those skilled in the art that additional magnification (taper) may be included if desired.

Lens system 73, represented schematically by the single lens, is mounted in spaced relation from surface 76 of bundle 71 so as to receive the image from surface 76 and magnify it an additional predetermined amount. In the present embodiment, lens system 73 magnifies the image another ten times (10×) so that the real image from apparatus 66 is magnified a total of twenty times. It will of course be understood that the lens system may be adjustable for focus and additional magnification, if desired, or may be fixed in a housing for simplicity. Because the image received by lens system 71 from bundle 71 is much larger than the real image generated by apparatus 66, the lens system does not provide the entire magnification and, therefore, is constructed larger and with less magnification. Because of this larger size, the lens system has a larger field of view and a greater working distance.

Eye relief is the distance that eye 77 can be positioned from viewing aperture 78 and still properly view the image, which distance is denoted by "d" in FIG. 7. Because of the size of lens system 73, eye relief, or the distance d, is sufficient to provide comfortable viewing and in the present embodiment is great enough to allow a viewer to wear normal eyeglasses, if desired. Because of the improved eye relief the operator can wear normal corrective lenses (personal eyeglasses), and the complexity of focusing and other adjustable features can be reduced, therefore, simplifying the construction of virtual image display 65.

Referring to FIG. 8, another miniature virtual image display 80 is illustrated in a simplified schematic. In waveguide virtual image display 80, image generation apparatus 81, similar to electro-optical package 50 described above, is affixed to the inlet of an optical waveguide 82 for providing a real image thereto. Waveguide 82 is formed generally in the shape of a parallelogram (side view) with opposite sides, 83, 84 and 85, 86, equal and parallel but not perpendicular to adjacent sides. Side 83 defines the inlet and directs light rays from the real image at apparatus 81 onto a predetermined area on adjacent side 85 generally along an optical-path defined by all four sides. Three diffractive lenses 87, 88 and 89 are positioned along adjacent sides 85, 84 and 86, respectively, at three predetermined areas and the magnified virtual image is viewable at an outlet in side 86. This particular embodiment illustrates a display in which the overall size is reduced somewhat and the amount of material in the waveguide is reduced to reduce weight and material utilized.

Referring to FIG. 9, another specific miniature virtual image display 90 is illustrated in a simplified schematic. In waveguide virtual display 90 an optical waveguide 91 having a generally triangular shape in side elevation is utilized. Image generation apparatus 92, similar to electro-optical package 50 described above, for producing a real image, is affixed to a first side 93 of optical waveguide 91 and emanates light rays which travel along an optical path directly to a diffractive lens 94 affixed to a second side 95. Light rays are reflected from lens 94 to a diffractive lens 96 mounted on a third side 97. Lens 96 in turn reflects the light rays through a final diffractive lens 98 affixed to the outlet of optical waveguide 91 in side 93, which lens 98 defines a viewing aperture for display 90. In this particular embodiment the sides of display 90 are angularly positioned relative to each other so that light rays enter and leave the inlet and outlet, respectively, perpendicular thereto.

Figure 10:
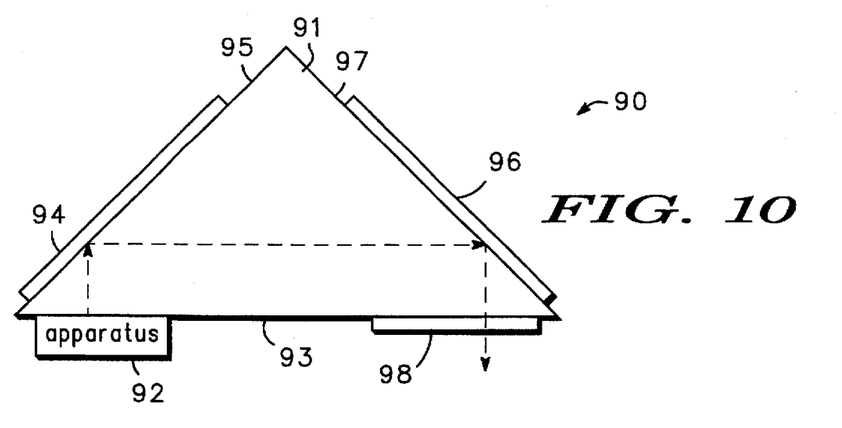

FIG. 10, illustrates a portable communications receiver 100 having a hand held microphone 101 with a miniature virtual display 102 mounted therein. It will of course be understood that portable communications receiver 100 can be any of the well known portable receivers, such as a cellular or cordless telephone, a two-way radio, a pager, etc. In the present embodiment, for purposes of explanation only, portable communications receiver 100 is a portable two-way police radio, generally the type carried by police officers on duty or security guards. Portable communications receiver 100 includes a control panel 105 for initiating calls and a standard visual display 106, if desired, for indicating the number called or the number calling. Alternately, 106 includes a speaker in addition to or instead of the visual display. Hand held microphone 101 has a push-to-talk switch 107 and a voice pick-up 108.

Figures 11, 12:
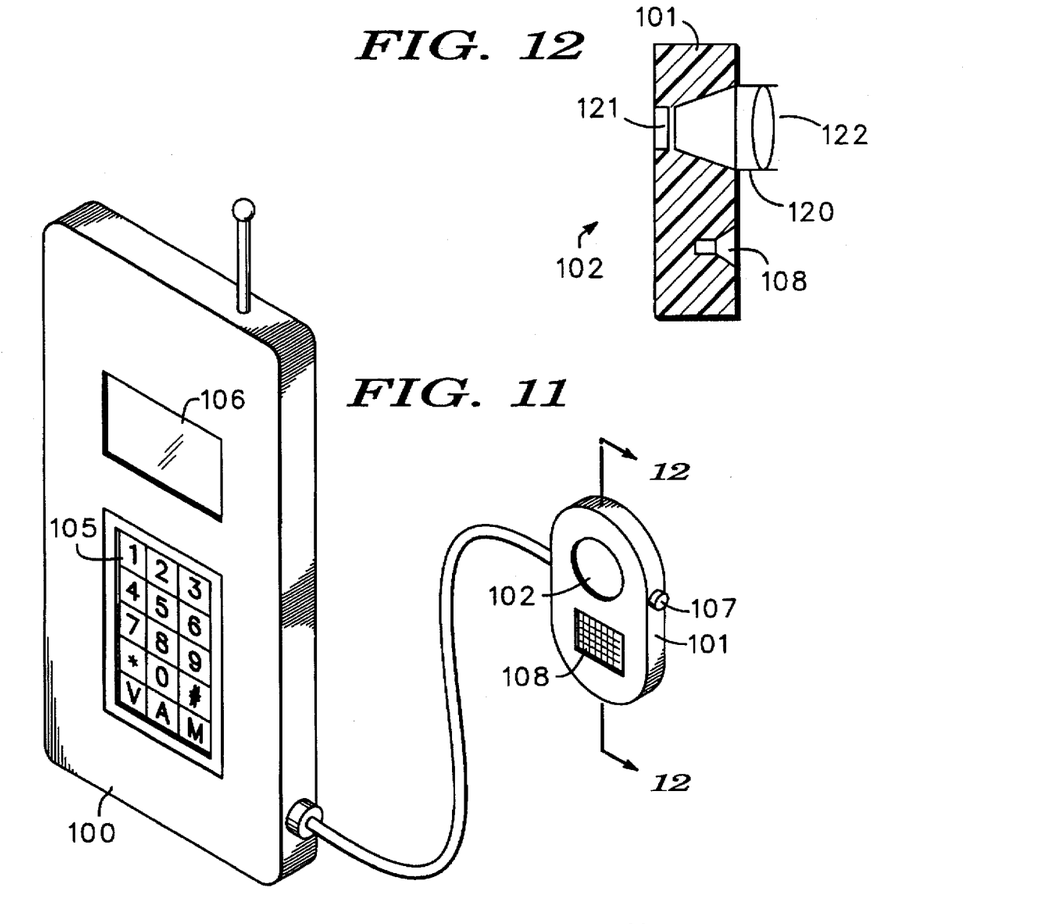
FIG. 11 is a view in perspective of a portable communications receiver incorporating the miniature virtual image display of FIG. 8.
FIG. 12 is a simplified view generally as seen from the line 12—12 of FIG. 11.

Referring to FIG. 11, a simplified sectional view of hand held microphone 11, as seen from the line 11—11, is illustrated. Miniature virtual display 102 includes an electro-optical package similar to package 50, described above, having image generation apparatus 121 for providing a real image to a fixed optical system 120, which in turn produces a virtual image viewable by the operator through an aperture 122. Fixed optical system 120 is constructed to magnify the entire real image from image generation apparatus 121, without utilizing moving parts, so that the virtual image viewable through aperture 122 is a complete frame, or picture, which appears to be very large (generally the size of a printed page) and is easily discernible by the operator. The entire electro-optical package is relatively small and adds virtually no additional space requirements to hand held microphone 11. Optical system 120 is constructed with no moving parts, other than optional features such as focusing, zoom lenses, etc. Further, apparatus 121 requires very little electrical power to generate the real image and, therefore, adds very little to the power requirements of portable communications receiver 100.

Figure 13:
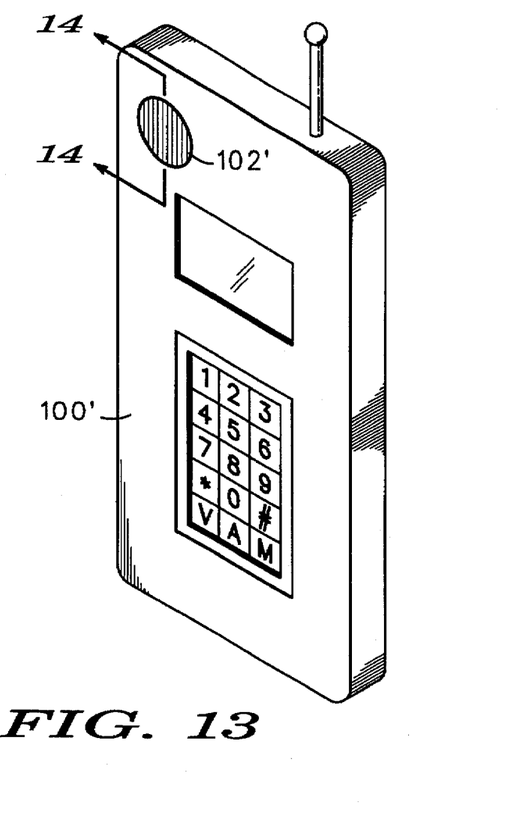
FIG. 13 is a view in perspective of another portable communications receiver incorporating the miniature virtual image display of FIG. 8

Referring specifically to FIGS. 12 and 13, a second embodiment is illustrated wherein parts similar to those described in relation to FIGS. 10 and 11 are designated with similar numbers with a prime added to the numbers to indicate a different embodiment. In this embodiment a portable communications receiver 100' has a miniature virtual display 102' included in the body thereof, instead of in a hand held microphone. A hand held microphone is optional and this specific embodiment is desirable for instances where a hand held microphone is not utilized or not available or for use in pagers and the like which do not transmit. Miniature virtual display 102' is basically similar to miniature virtual display 102 of FIGS. 10 and 11 and adds very little to the size, weight, or power consumption of receiver 10'.

Figure 14:
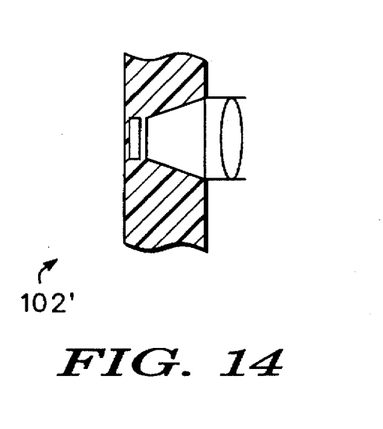
FIG. 14 is a simplified view generally as seen from the line 14—14 of FIG. 13.

FIG. 14 is a perspective view of hand held microphone 101 illustrating a typical view 125 seen by an operator looking into viewing aperture 122 of miniature virtual image display 102, described in conjunction with FIGS. 10 and 11. View 125 could be, for example, a floor plan of a building about to be entered by the operator (a policeman). In operation, the floor plan is on file at the police station and, when assistance is requested by the policeman, the station simply transmits video representative of the previously recorded plan. Similarly, miniature virtual image display 102 might be utilized to transmit pictures of missing persons or wanted criminals, maps, extremely long messages, etc. Many other variations, such as silent receiver operation wherein the message appears on display 102 instead of audibly, are possible.

In some applications, light emitting devices 12 and electrical conductors 15 and 17 on semiconductor chip 10 can be very small, micron or even sub-micron size, with the pitch, P, being too small to conveniently form operable connecting/mounting pads 20 thereto. In such applications the spacing between connecting/mounting pads 20 can be increased by forming light emitting devices into a push-pull array, as described in conjunction with FIGS. 15 through 18, described below.

Figure 15:
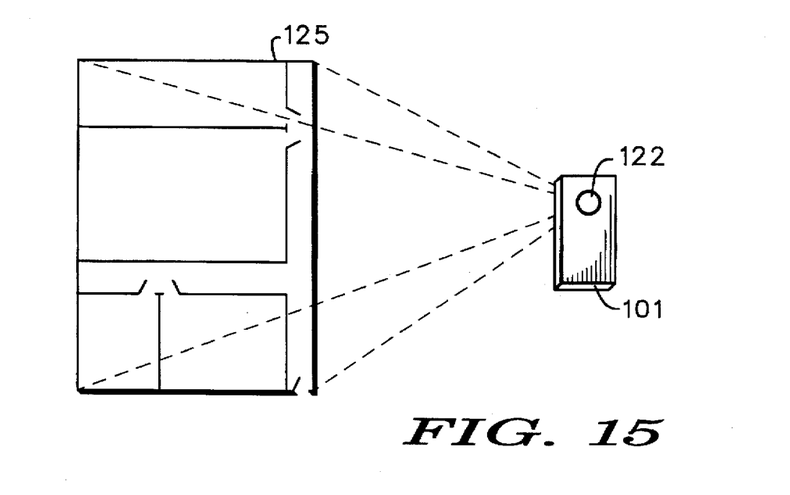
FIG. 15 is a view in perspective illustrating a typical view as seen by the operator of the portable communications receiver of FIG. 11.

Referring specifically to FIG. 15, a push-pull array 210 of light emitting diodes is illustrated. Array 210 includes twenty light emitting diodes formed on a single substrate and arranged into five rows and four columns. Only twenty diodes are illustrated for simplicity and it should be understood that they are representative of the larger arrays described above. Rows of connecting conductors, designated 212 through 216, are positioned on the substrate to correspond, one each, with the diode rows and columns of connecting conductors, designated 220 through 223, are positioned on the substrate to correspond, one each, with the diode columns. The connecting conductors are couple to each anode and cathode of the diodes to provide addressable array 210, with all alternate columns of diodes being reverse connected. Thus, all of the diodes in alternate columns have a cathode connected to the column conductor, i.e. conductors 220 and 222, and all of the diodes in interspersed columns have an anode connected to the column conductors, i.e. conductors 221 and 223. Similarly, in each row, the anode of alternate diodes is connected to the row conductor and the cathode of interspersed diodes is connected to the row conductor. Array 210 is designed for an LED display and, therefore, alternate columns of diodes are reverse connected, for reasons which will be apparent presently. It will of course be understood that in many applications it may be more convenient to reverse alternate rows of diodes and, therefore, the terms "row" and "column" are generally used interchangeably herein.

The reverse connected LEDs, as applied to an LED imaging array, is feasible because the LED imaging array is fabricated on a GaAs substrate with the diodes being internally reverse coupled while retaining an acceptable pitch. This embodiment results in an efficient internal interconnect which requires no additional devices on the LED array and very little additional work during fabrication of the array. Other embodiments exist but require additional devices which are difficult to fabricate and take up additional space.

Each of the row conductors 212 through 216 have a connection/mounting pad connected thereto. Each alternate column conductor is connected to an adjacent interspersed column conductor to form pairs of column conductors, 220, 221 and 222, 223. Each pair of column conductors has a single connection/mounting pad connected thereto. In push-pull array 210 there are only two connection/mounting pads to all four columns 220-223. Thus, in simplified push-pull array 210, the number of external connection/mounting pads has been reduced from the traditional number of nine to only seven. It will be apparent to those skilled in the art that expanding push-pull array 210 to 128 rows and 240 columns will result in a total of 128×240/2=248 total external connections. Thus, the total number of external connections has been reduced by 120 external connections.

Figure 16:
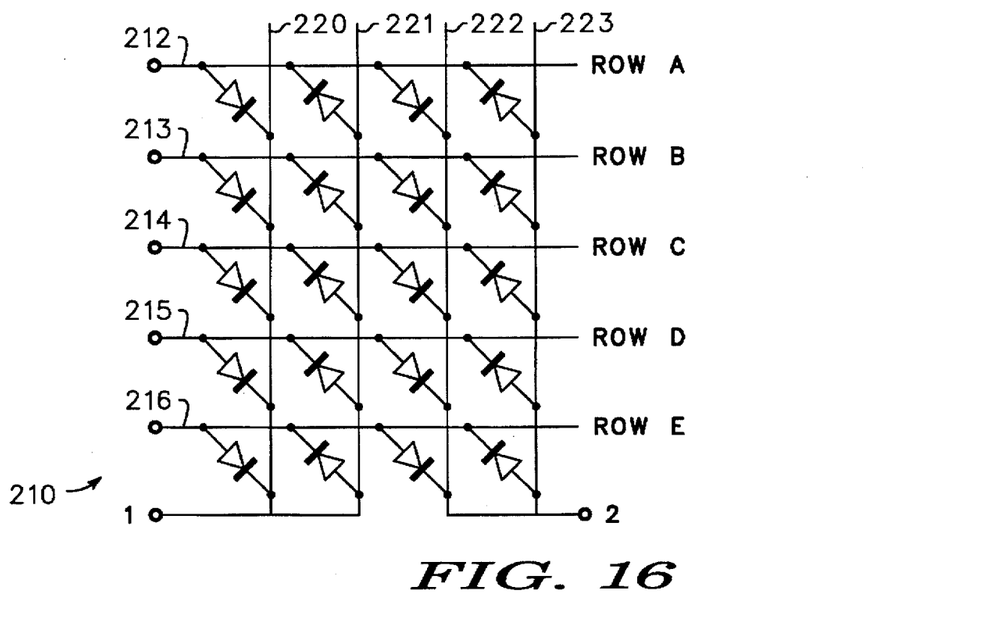
FIG. 16 illustrates a schematic diagram of a push-pull array of light emitting diodes.

Referring specifically to FIG. 16, a column driving circuit 230 is illustrated, which is designed to be utilized with push-pull array 210. Column driving circuit 230 includes a counter 231 and a plurality of logic circuits 232, only one of which is illustrated. Each logic circuit 232 includes a first logic gate 233, a pair of logic gates 234 and 235 and P and N channel complementary drivers 236 and 237, respectively. In this specific embodiment, counter 231 is a nine bit counter, which may for example be a simple ripple counter. Also, in each logic circuit 232, first logic gate 233' is an eight input NAND gate, and logic gates 234 and 235 are two input NOR gates. Complementary drivers 236 and 237 are P and N channel FETs connected in series between a power source $V_{DD}$ and a reference voltage, which in this instance is ground.

The first bit output of counter 231 is used as a polarity bit and is applied, in each logic circuit 232, directly to one input terminal of gate 235 and through an inverter to one input terminal of gate 234. The next eight output bits of counter 231 are applied, in each logic circuit 232, to the eight input terminals of gate 233. The eight input terminals are coded so that only one specific combination of output bits will cause gate 233, in each logic circuit 232, to produce an output. The coded connection to each gate 233 can be accomplished in a variety of ways, as for example inverting all inputs in the first logic circuit. In this fashion gate 233 of the first logic circuit would produce an output each time counter 231 produced the output 00000000. Similarly, gate 33 of the next logic circuit is coded so that an output is produced in response to the output 00000001 from counter 231, and so on.

The output terminal of gate 233 is connected directly to second input terminals of each of gates 234 and 235. An output terminal of gate 234 is inverted and applied to the control gate of driver 236 and an output terminal of gate 235 is applied directly to the control gate of driver 237. The junction of drivers 236 and 237, which is output terminal 238, is connected to the connection/mounting pad of columns 220, 221 of push-pull array 210. In this specific embodiment, the first (least significant) output bit of counter 231 alternately selects gate 235 (a 0 output bit) and, on the next clock pulse, gate 234 (a 1 output bit). Further, the other eight output bits remain constant through this switching of the first bit, so that on the first two clock pulses applied to counter 231: first, driver 237 is activated to ground output terminal 238 and then driver 236 is activated to apply $V_{DD}$ to output terminal 238. Thus, column 220 of push-pull array 210 is addressed on the first clock pulse and column 221 is addressed on the second clock pulse. Because eight output bits of counter 231 are utilized to address the plurality of logic circuits 233, as many as 256 logic circuits can be individually addressed.

Figure 17:
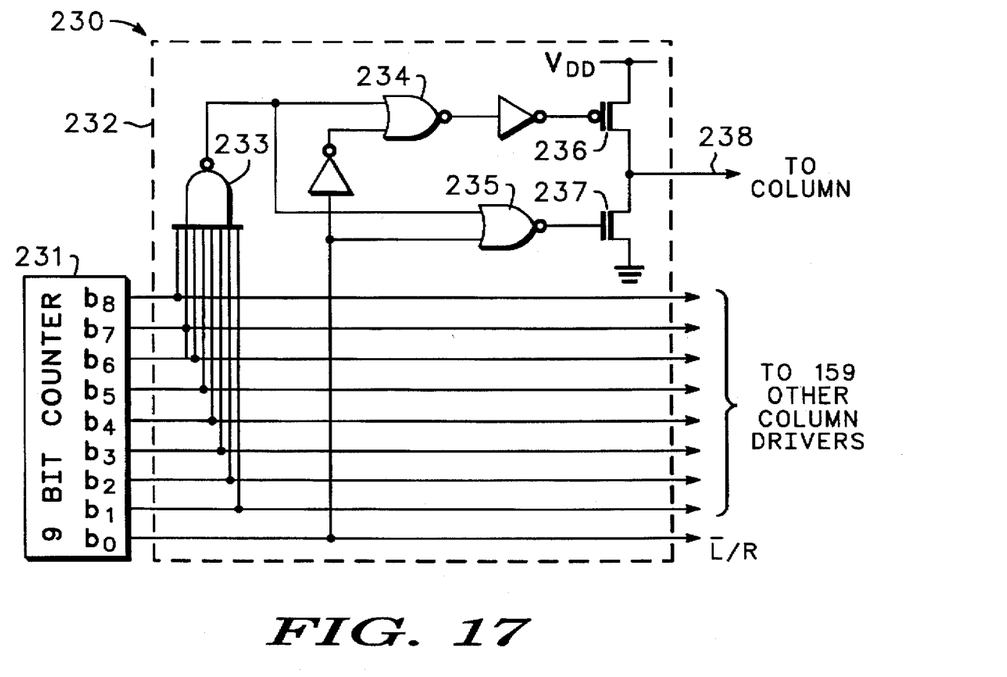
FIG. 17 is a block diagram of a portion of a driving circuit for the array of FIG. 16.

Referring specifically to FIG. 17, a single row driving circuit 240 is illustrated. A similar row driving circuit 240 is provided for each row connection/mounting pad. Each row driving circuit 240 includes a pair of two input terminal gates 241 and 242, two P channel drivers 243 and 244 and two N channel drivers 245 and 246. The P channel drivers 243 and 244 are connected in series between power source $V_{DD}$ and an output terminal 247. The N channel drivers 245 and 246 are connected in series between output terminal 245 and a reference potential, which in this embodiment is ground. P channel driver 243 and N channel driver 246 act as constant current sources and are activated by bias voltages applied to the control gates thereof. An output terminal of gate 241 is connected to the control gate of P channel driver 244 and an output terminal of gate 242 is connected to the control gate of N channel driver 245. One input terminal of each of gates 241 and 242 is connected to a data input terminal 248. The second input terminal of gate 241 is connected through an inverter to the first (least significant) output bit terminal of counter 231 and the second input terminal of gate 242 is connected directly to the first output bit terminal of counter 231.

In this embodiment, data on terminal 248 consists of a series of 1's and 0's which are indicative of whether a specific LED is to be activated or not. However, since the diodes in interspersed columns 221 and 223 are reverse connected, it is necessary to apply a potential to the rows which is lower than the potential applied to interspersed columns 221, 223 to activate these diodes. Also, for the alternate columns in which the diodes are not reverse connected, a positive potential must be applied to the selected rows to activate the diodes. Thus, when an alternate column 220 or 222 is selected by the first output bit of counter 231, the same output bit of counter 231 causes gates 241 and 242 of the row driver circuits to select P channel driver 244 which, if the current data bit is a 1, is turned on. Similarly, when an interspersed column 221 or 223 is selected by the first output bit of counter 231, the same output bit of counter 231 causes gates 241 and 242 of the row driver circuits to select N channel driver 245 which, if the current data bit is a 1, is turned on.

Figure 18:
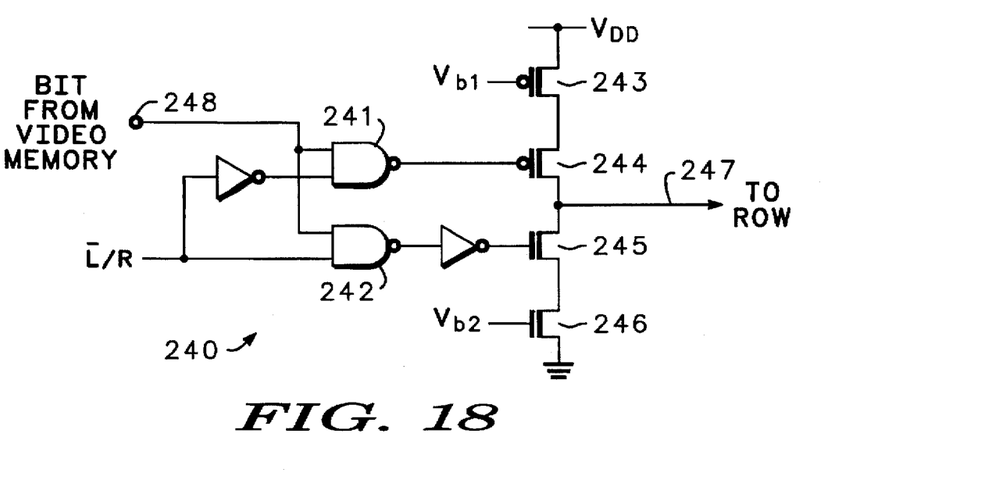
FIG. 18 illustrates another portion of a driving circuit for the array of FIG. 16.
Figure 19:
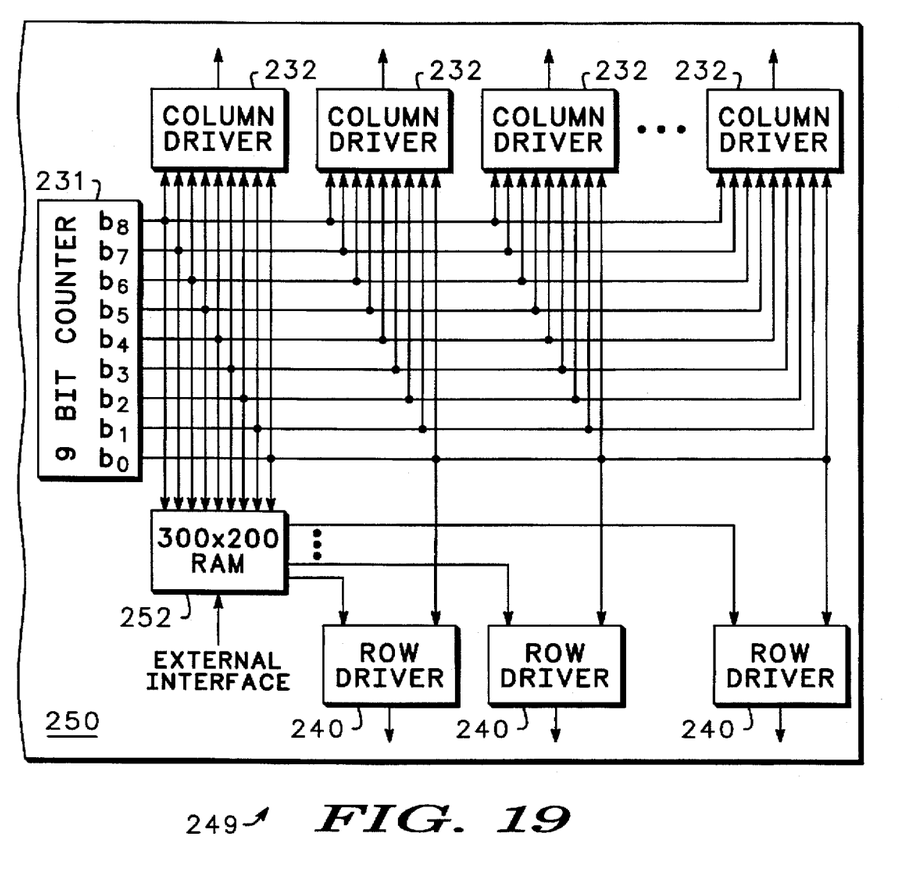
FIG. 19 illustrates the array of FIG. 16 and drivers of FIGS. 17 and 18 incorporated into an electronic device.

FIG. 18 illustrates an electronic communication device 249 including a simplified block diagram of a complete driving circuit 250 for the array of FIG. 15 to provide a complete display. Communications device 249 is any device which might incorporate a display for displaying messages to be sent and/or received, for example a two way radio or pager. Driving circuit 250 includes counter 231, a plurality of logic circuits 232, a plurality of row driving circuits 240 and a random access memory (RAM) 252 connected to receive video data from an external interface. Counter 231 supplies the polarity bit and the eight bit address to each of the plurality of logic circuits 232, as described above. Thus, each of the columns is sequentially addressed. Counter 231 also supplies the polarity bit to each of the plurality of row drivers 240 and clocks RAM 252 so that data bits are supplied to the plurality of row drivers 240 in synchronism with the address inputs and polarity bit supplied to logic circuits 232 and row drivers 240.

The number of connection/mounting pads, required to address the columns in the array is reduced by one-half. Further, reversing the connections to interspersed columns is accomplished internally while manufacturing the array so that no additional space and virtually no additional processing steps are required. Also, the internal connections do not require additional devices on the array. The push-pull array requires no additional complicated driving circuits, or additional bus lines in the driving circuits, or expensive external circuitry. The simplicity of the driving circuits is illustrated in the disclosed driving circuits. While specific driving circuits have been disclosed which incorporate the speed and convenience of CMOS circuits, it will be understood that other driving circuits utilizing different conductivity types, etc. may be devised. Further, it will be understood that all of the driving circuits explained with reference to FIGS. 16 through 18 are, or can be, included in driver and control circuits 57, illustrated in FIGS. 5 and 6.

Thus, the present invention illustrates and teaches integrated electro-optical packages which are not limited in size by the electrical connections and which are substantially smaller than previous integrated packages which perform the same functions. Also, the present invention illustrates and teaches integrated electro-optical packages which contain arrays of light generating devices with substantially greater numbers of devices than previous integrated packages. Further, the need for interconnect and packaging structures and techniques which can substantially reduce the limitation on size of semiconductor chips and which can reduce the amount of required surface area is substantially reduced, or eliminated, by the present invention.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A portable electronic device with visual display comprising:

a portable electronic device having a data output terminal; and a miniature virtual image display having a viewing aperture, the display being operably attached to the receiver and including a semiconductor chip having a major surface with a plurality of light emitting devices formed on the major surface, each of the light emitting devices having first and second electrodes for activating the light emitting devices, the light emitting devices defining a plurality of pixels positioned in rows and columns and cooperating to generate a complete real image, when activated, at a central portion of the major surface, the semiconductor chip further having external connection/mounting pads adjacent outer edges thereof and outside of the central portion of the major surface with the first electrodes of the light emitting devices being connected to a first plurality of the external connection/mounting pads defining rows of pixels and the second electrodes of the light emitting devices being connected to a second plurality of the external connection/mounting pads defining columns of pixels;

a window frame substrate having a major surface and defining a central optically transparent light passage therethrough substantially coextensive with the real image at the central portion of the major surface of the semiconductor chip, the window frame substrate further having a plurality of electrical conductors formed therein, each extending from a mounting pad adjacent an edge of the central passage to a connection pad on the major surface of the window frame substrate, the major surface of the semiconductor chip being mounted on the major surface of the window frame substrate with the first and second pluralities of external connection/mounting pads being in electrical contact with the mounting pads of the window frame substrate and real image at the central portion of the major surface of the semiconductor chip being axially aligned and coextensive with the central passage in the major surface of the window frame substrate;

a plurality of driver and controller circuits having data input terminals connected to the data output terminal of the electronic device and further having control signal output terminals adapted to be connected to the first and second terminals of the light emitting devices for activating the light emitting devices to generate real images in accordance with data signals applied to the data input terminals; and a mounting board having first and second opposed major surfaces with first electrical connection pads on the first major surface, second electrical connection pads on the second major surface and electrical connections formed in the mounting board between the first and second electrical connection pads, the plurality of driver and controller circuits being mounted on the first side of the mounting board with the control signal output terminals electrically contacting the first electrical connection pads, the window frame substrate being mounted on the second major surface of the mounting board with the second electrical connection pads in electrical contact with the first and second pluralities of external connection/mounting pads; and optics mounted in the electronic device and axially aligned with the central passage in the window frame substrate for defining the aperture and providing a virtual image from the real image generated by the array of light emitting devices, the real image being easily viewable by an operator of the electronic device.

2. A portable electronic device with visual display as claimed in claim 1 wherein the optics is designed to magnify the real image generated by the semiconductor chip and produce a virtual image viewable by a human eye.

3. A portable electronic device with visual display as claimed in claim 2 wherein the major surface of the semiconductor chip is generally rectangular in shape and the size is less than approximately one half inch on a side.

4. A portable electronic device with visual display as claimed in claim 3 wherein the array of light emitting devices formed on the major surface at a central portion of the semiconductor chip includes light emitting devices formed in an area of the major surface less than approximately 10 microns in diameter.

5. A portable electronic device with visual display as claimed in claim 4 wherein the array of light emitting devices formed on the major surface at a central portion of the semiconductor chip includes light emitting devices positioned in rows and columns with adjacent rows and adjacent columns being positioned less than approximately 30 microns apart.

6. A portable electronic device with visual display as claimed in claim 1 wherein the portable electronic device includes portable communications equipment.

7. A portable electronic device with visual display as claimed in claim 6 wherein the portable communications equipment is one of a cellular telephone, a two-way radio and a pager.

8. An integrated electro-optical package as claimed in claim 1 wherein the array of light emitting devices formed on the semiconductor chip is positioned in a push-pull array.

9. A method of fabricating an electro-optical package comprising the steps of:

forming a plurality of light emitting devices on the major surface of a semiconductor chip, each of the light emitting devices having first and second electrodes for activating the light emitting devices, the light emitting devices defining a plurality of pixels positioned in rows and columns and cooperating to generate a complete real image, when activated, at a central portion of the major surface, the semiconductor chip further being formed with external connection/mounting pads adjacent outer edges thereof and outside of the central portion of the major surface with the first electrodes of the light emitting devices being connected to a first plurality of the external connection/mounting pads defining rows of pixels and the second electrodes of the light emitting devices being connected to a second plurality of the external connection/mounting pads defining columns of pixels;

forming a window frame substrate having a major surface and defining a central optically transparent light passage therethrough substantially coextensive with the real image at the central portion of the major surface of the semiconductor chip, forming a plurality of electrical conductors in the window frame substrate, a plurality of mounting pads adjacent an edge of the central passage and a plurality of connection pads on the major surface of the window frame substrate with each electrical conductor connecting a connection pad to a mounting pad;

mounting the major surface of the semiconductor chip on the major surface of the window frame substrate with the first and second pluralities of external connection/mounting pads of the semiconductor chip being in electrical contact with the mounting pads of the window frame substrate and the real image at the central portion of the major surface of the semiconductor chip being axially aligned with the central passage in the major surface of the window frame substrate;

forming a plurality of driver and controller circuits having data input terminals and further having control signal output terminals adapted to be connected to the first and second terminals of the light emitting devices for activating the light emitting devices to generate real images in accordance with data signals applied to the data input terminals; forming a mounting board with first and second opposed major surfaces and forming first electrical connection pads on the first major surface, second electrical connection pads on the second major surface and electrical connections in the mounting board between the first and second electrical connection pads;

mounting the plurality of driver and controller circuits on the first side of the mounting board with the control signal output terminals electrically contacting the first electrical connection pads; and mounting the window frame substrate on the second major surface of the mounting board with the second electrical connection pads in electrical contact with the first and second pluralities of external connection/mounting pads.

10. A method of fabricating an electro-optical package as claimed in claim 9 wherein the step of forming a mounting board with first electrical connection pads on the first major surface thereof includes the step of forming the first electrical connection pads as mounting bumps.

11. A method of fabricating an electro-optical package as claimed in claim 10 wherein the step of forming the mounting bumps includes forming the mounting bumps from material selected from the group including solder, gold, and conducting epoxy.

12. A method of fabricating an electro-optical package as claimed in claim 9 wherein the step of forming a mounting board with second electrical connection pads on the second major surface thereof includes the step of forming the second electrical connection pads as mounting bumps.

13. A method of fabricating an electro-optical package as claimed in claim 12 wherein the step of forming the mounting bumps includes forming the mounting bumps from material selected from the group including solder, gold, and conducting epoxy.

14. A method of fabricating an electro-optical package as claimed in claim 9 wherein the step of forming a plurality of electrical conductors in the window frame substrate, a plurality of mounting pads adjacent an edge of the central passage and a plurality of connection pads on the major surface of the window frame substrate includes the steps of forming the mounting pads and the connection pads as mounting bumps.

15. A method of fabricating an electro-optical package as claimed in claim 14 wherein the step of forming the mounting bumps includes forming the mounting bumps from material selected from the group including solder, gold, and conducting epoxy.

16. A method of fabricating an electro-optical package as claimed in claim 9 wherein the step of forming a window frame substrate having a major surface includes providing a piece of planar glass and defining a central area for the central passage.

17. A method of fabricating an electro-optical package as claimed in claim 16 wherein the step of forming a plurality of light emitting devices on the major surface of a semiconductor chip includes selecting the semiconductor chip with a predetermined temperature coefficient of expansion and the step of providing a piece of planar glass includes selecting the glass with a temperature coefficient substantially similar to the temperature coefficient of the semiconductor chip.

* * * * *